(12) United States Patent
Takeuchi (10) Patent No.: US 7,880,512 B2
(45) Date of Patent: Feb. 1, 2011

(54) OUTPUT DRIVER CIRCUIT

(75) Inventor: Daishi Takeuchi, Chiba (JP)

(73) Assignee: Kawasaki Microelectronics, Inc., Chiba-Shi (JP)

( * ) Notice: Subject to any disclaimer, the term of this patent is extended or adjusted under 35 U.S.C. 154(b) by 105 days.

(21) Appl. No.: 12/292,997

(22) Filed: Dec. 2, 2008

(65) Prior Publication Data

US 2009/0160496 A1    Jun. 25, 2009

(30) Foreign Application Priority Data

Dec. 21, 2007    (JP) .............................. 2007-329663

(51) Int. Cl.
*H03B 1/00* (2006.01)

(52) U.S. Cl. .................. 327/108; 327/112; 327/170

(58) Field of Classification Search ......... 327/108–112, 327/379, 389, 391, 170, 65; 326/26, 27, 326/30, 82, 83

See application file for complete search history.

(56) References Cited

U.S. PATENT DOCUMENTS

| 6,111,431 | A * | 8/2000 | Estrada | 326/83 |
| 7,129,756 | B2 * | 10/2006 | Omote | 327/108 |
| 2005/0007150 | A1 * | 1/2005 | Omote | 326/83 |
| 2007/0279105 | A1 * | 12/2007 | Sunairi | 327/108 |

FOREIGN PATENT DOCUMENTS

JP    B2-3967321    8/2007

\* cited by examiner

*Primary Examiner*—Long Nguyen
(74) *Attorney, Agent, or Firm*—Oliff & Berridge, PLC (57) ABSTRACT

In an output driver circuit, a replica circuit includes seventh and eighth transistors corresponding to first and second transistors, respectively, ninth and tenth transistors corresponding to third or fifth, and fourth or sixth transistors in a driver circuit, respectively, and a resistor corresponding to a termination resistor. A reference voltage and a voltage of a node between the ninth transistor and the resistor are input to an operational amplifier, and an output signal of the operational amplifier is input to gates of the first and seventh transistors.

6 Claims, 5 Drawing Sheets

OUTPUT DRIVER CIRCUIT

BACKGROUND OF THE INVENTION

1. Field of the Invention

The present invention relates to an output driver circuit for outputting differential signals.

2. Description of the Related Art

Several intra-panel interface bus standards between the panel timing controller (T-con) and the column drivers, such as RSDS (reduced swing differential signaling), mini-ENDS (mini-low voltage differential signaling), PPDS (point to point differential signaling), are defined and used widely.

Figure 3:
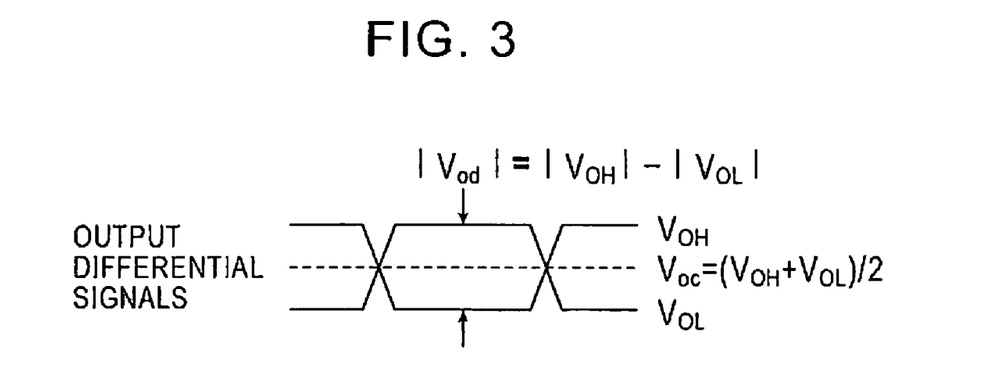
FIG. 3 is a schematic diagram illustrating a relationship between a high-level voltage $V_{OH}$ and a low-level voltage $V_{OL}$ of differential output signals, an output amplitude voltage $V_{od}$, and an output common mode voltage $V_{oc}$.

In the interface bus standards, depending on an application, specifications of an output amplitude voltage $V_{od}$ and an output common mode voltage $V_{oc}$ of differential output signals are defined. As illustrated in FIG. 3, the output amplitude voltage $V_{od}$ is a differential voltage ($|V_{od}|=|V_{OH}|-|V_{OL}|$) between a high-level voltage $V_{OH}$ and a low-level voltage $V_{OL}$ of differential output signals. The output common mode voltage $V_{oc}$ is a midpoint voltage ($V_{oc}=(V_{OH}+V_{OL})/2$) of the high-level voltage $V_{OH}$ and the low-level voltage $V_{OL}$ of the differential output signals.

Accordingly, it is desirable to maintain the output amplitude voltage $V_{od}$ and the output common mode voltage $V_{oc}$. Methods for controlling the output amplitude voltage $V_{od}$ and the output common mode voltage $V_{oc}$ are important for obtaining a stable output. For example, the following methods have been proposed: a method to use a common feedback on each driver circuit, and a method to use in common a replica circuit by a plurality of driver circuits.

In the common feedback method, within each driver circuit, two serially connected resistors are provided between output nodes of differential signals in the individual driver circuit. Using an operational amplifier, a transistor that determines an output common mode voltage $V_{oc}$ of an output driver circuit is controlled such that an externally supplied reference voltage is equal to a voltage, the output common mode voltage $V_{oc}$ in the driver circuit, of a node at a midpoint of the two resistors.

Meanwhile, in the replica circuit method, an operational amplifier, and a replica circuit, which is an equivalent circuit of a driver circuit to which an external termination resistor is connected, are commonly used by a plurality of driver circuits. Using the operational amplifier, a transistor that determines an output common mode voltage $V_{oc}$ of the driver circuit is controlled such that an externally supplied reference voltage is equal to a voltage, the output common mode voltage $V_{oc}$ of the driver circuit, of a node at a midpoint of two resistors. These two resistors have a resistance value that is half of the termination resistor and are serially connected to nodes in the replica circuit. The nodes correspond to output nodes of differential signals in the driver circuit.

Hereinafter, a conventional output driver circuit that employs the replica circuit method is described.

Figure 4:
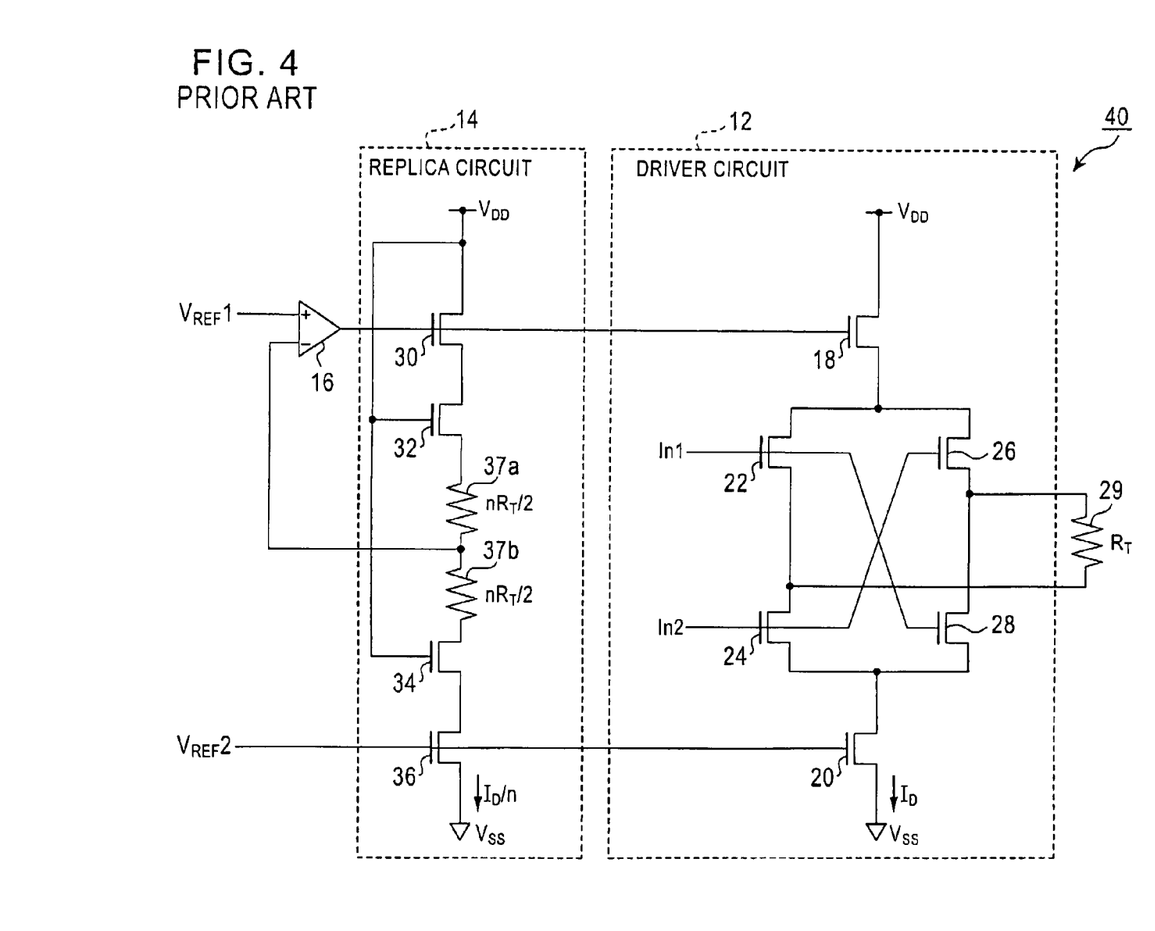
FIG. 4 is a view illustrating an example of a conventional output driver circuit.

FIG. 4 is a view illustrating an example of a conventional output driver circuit. The output driver circuit 40 illustrated in FIG. 4 has been proposed in Japanese Patent No. JP-B-3967321. The output driver circuit 40 includes a driver circuit 12 at an output final stage, a replica circuit 14, and an operational amplifier 16.

The driver circuit 12 includes N type MOS transistors (hereinafter, referred to as NMOS) 18, 20, 22, 24, 26, and 28. The NMOS 18 controls an output common mode voltage $V_{oc}$. The NMOS 20 controls a current $I_D$ flowing in the driver circuit 12. The four NMOSs 22, 24, 26, and 28 perform switching in response to differential input signals In1 and In2 supplied from a circuit (for example, predriver circuit) in a preceding stage to supply differential output signals to both ends of an external termination resistor 29.

In the driver circuit 12, for example, in a case where the differential input signals In1 and In2 are at a high level and at a low level, respectively, the NMOS 22 and NMOS 28 are ON-state, and the NMOS 24 and NMOS 26 are OFF-state. Then, the current $I_D$ flows from a power supply $V_{DD}$ to a ground $V_{SS}$ via the NMOS 18, the NMOS 22, the termination resistor 29, the NMOS 28, and the NMOS 20. On the other hand, in a case where the differential input signals In1 and In2 are at a low level and at a high level, respectively, the current flows in a state opposite to the above.

The replica circuit 14 includes an NMOS 30 corresponding to the NMOS 18 in the driver circuit 12, a NMOS 32 corresponding to the NMOS 22 or the NMOS 26 in an ON-state, two serially connected resistors 37a and 37b corresponding to the termination resistor 29, an NMOS 34 corresponding to the NMOS 24 or the NMOS 28 in an ON-state, and an NMOS 36 corresponding to the NMOS 20.

A size of each NMOS that forms the replica circuit 14 is 1/n times (n is a positive integer) of a size of the corresponding NMOS that forms the driver circuit 12. Each of the two resistors 37a and 37b has a resistance value $nR_T/2$ that is n/2 times a resistance value $R_T$ of the termination resistor 29.

An externally supplied reference voltage $V_{REF}2$ is commonly input to a gate of the NMOS 36 in the replica circuit 14 and a gate of the NMOS 20 in the driver circuit 12 so as to form a current mirror circuit. As described above, since the NMOS 36 and the NMOS 20 form the current mirror circuit, in the replica circuit 14, a current $I_D/n$ that is 1/n times of the current $I_D$ flowing in the driver circuit 12 flows through the NMOS 36.

An externally supplied reference voltage $V_{REF}1$ is input to a positive input terminal in the operational amplifier 16. A voltage of a node at a midpoint of the two resistors 37a and 37b in the replica circuit 14 is fed back to a negative input terminal of the operational amplifier 16. By this configuration, the NMOS 30 is controlled by the operational amplifier 16 such that the voltage of the node at the midpoint of the two resistors 37a and 37b in the replica circuit 14 is equal to the reference voltage $V_{REF}1$.

An output signal of the operational amplifier 16 is commonly supplied to a gate of the NMOS 30 in the replica circuit 14 and a gate of the NMOS 18 in the driver circuit 12. Accordingly, the voltage of the node at the midpoint of the two resistors 37a and 37b in the replica circuit 14 varies simultaneously with the output common mode voltage $V_{oc}$ of the differential output signals supplied from the driver circuit 12 to both ends of the termination resistor 29. As a result, and the voltage $V_{oc}$ is controlled to be a voltage equal to the reference voltage $V_{REF}1$.

An output amplitude voltage $V_{od}$ of the differential output signals supplied from the driver circuit 12 to the both ends of the termination resistor 29 is determined by a product of the resistance value $R_T$ of the termination resistor 29 and the current $I_D$ flowing in the driver circuit 12 in accordance with the reference voltage $V_{REF}2$ ($V_{od}=R_T \times I_D$).

However, the resistance value $nR_T/2$ of the two resistors 37a and 37b in the replica circuit 14 embedded in an LSI circuit vary within a range of ±20%, under the influence of manufacturing process variation. The variation is larger than the variation of the resistance value $R_T$ of the external termination resistor 29, which is normally within a range of several percent.

Accordingly, even if the feedback control accurately maintains the voltage of the node at the midpoint of the two resistors 37a and 37b equal to the reference voltage $V_{REF}1$, the output common mode voltage $V_{oc}$ of the differential signals output from the output driver circuit 40 varies by a mismatch between the resistance values $nR_T/2$ of the built-in resistors 37a and 37b and the resistance value $R_T$ of the external termination resistor 29.

SUMMARY OF THE INVENTION

Accordingly, it is an object of the present invention to solve the problems in the conventional art and provide an output driver circuit capable of maintaining an output common mode voltage of differential output signals to a certain value even if a mismatch exists between a resistance value of a resistor integrated in an LSI and a resistance value of an external termination resistor.

To achieve the above object, an output driver circuit includes a driver circuit, a replica circuit, and an operational amplifier. The driver circuit includes a first transistor connected to a first power supply, a second transistor connected to a second power supply, third and fourth, and fifth and sixth transistors connected between the first transistor and the second transistor, respectively, in series. Differential signals from a circuit in a preceding stage are input to gates of the third and sixth transistors and gates of the fourth and fifth transistors, respectively, and differential signals are output from a node between the third and fourth transistors and a node between the fifth and sixth transistors. The replica circuit includes seventh and eighth transistors corresponding to the first and second transistors respectively, ninth and tenth transistors corresponding to the third or fifth, and the fourth or sixth transistors respectively, and a resistor corresponding to a termination resistor connected between the differential signals output from the driver circuit. The seventh and ninth transistors, the resistors, and the tenth and eighth transistors are connected between the first and second power supplies, in that order, and the first power supply is input to gates of the ninth and tenth transistors. An externally supplied first reference voltage and a voltage of a node between the ninth transistor and the resistor are input to the operational amplifier, and an output signal of the operational amplifier is input to gates of the first and seventh transistors. An externally supplied second reference voltage is input to gates of the second and eighth transistors and a current mirror circuit is formed.

In the output driver circuit, it is preferable that sizes of the transistors in the replica circuit are 1/n (n is an integer of one or more) times those of the transistors in the driver circuit, and a resistance value of the resistor is n times a resistance value of the termination resistor.

In the output driver circuit, it is preferable that one replica circuit and one operational amplifier are commonly used by a plurality of driver circuits.

An output amplitude voltage of the differential output signals may be determined by a product of the resistance value of the termination resistor and a current flowing in the driver circuit in accordance with the externally supplied second reference voltage.

According to feedback control by the operational amplifier, the voltage of the node between the ninth transistor and the resistor in the replica circuit may be controlled to be a value equal to the first reference voltage. By commonly controlling the seventh transistor in the replica circuit and the first transistor in the driver circuit using the output signal of the operational amplifier, a high-level voltage of the differential output signals may be controlled to be equal to the first reference voltage.

An output common mode voltage of the differential output signals may be determined by the high-level voltage of the differential output signals and the output amplitude voltage.

Thus, according to the output driver circuit described above, without being affected by a fluctuation of the resistance value of the resistor embedded in the replica circuit 14, the output common mode voltage of the differential output signals can be maintained at a constant value.

DETAILED DESCRIPTION OF EMBODIMENTS

Hereinafter, an output driver circuit according to this disclosure is described in detail with reference to the attached drawings.

Figure 1:
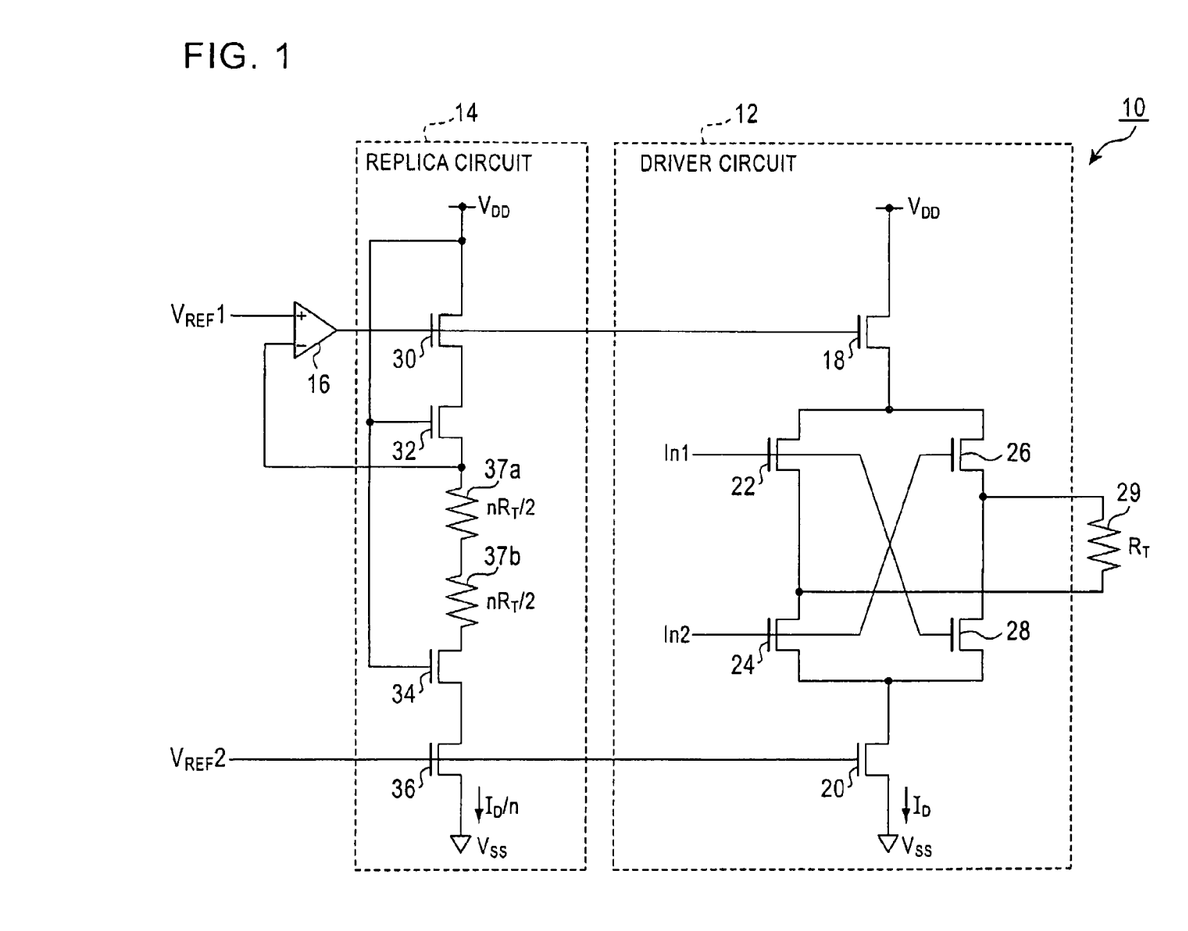
FIG. 1 is a view illustrating an exemplary embodiment of an output driver circuit according to this disclosure.

FIG. 1 is a view illustrating an exemplary embodiment of an output driver circuit according to this disclosure. According to FIG. 1, an output driver circuit 10 includes the driver circuit 12 at an output final stage, the replica circuit 14, and the operational amplifier 16. In the drawing, reference voltages $V_{REF}1$ and $V_{REF}2$ are externally supplied constant bias voltages. The reference voltages $V_{REF}1$ and $V_{REF}2$ may be generated using, for example, band-gap reference circuits in integrated in the same LSI chip in which the driver circuit 12 and the replica circuit 14 are integrated. The signals In1 and In2 are differential input signals supplied from a circuit (for example, a predriver circuit) in a preceding stage.

The output driver circuit 10 differs from the conventional output driver circuit 40 shown in FIG. 4 in the node fed back to the negative input terminal in the operational amplifier 16. That is, in the output driver circuit 10, not the voltage at the node between the resistors 37a and 37b in the output driver circuit 40, but a voltage at a node between the NMOS 32 and the resistor 37a is fed back to the negative input terminal in the operational amplifier 16.

The driver circuit 12 includes the NMOS 18, the NMOS 20, the NMOS 22, the NMOS 24, the NMOS 26, and the NMOS 28. The NMOS 18 controls a high-level voltage $V_{OH}$ of differential output signals. The NMOS 20 controls a current $I_D$ flowing in the driver circuit 12. The four NMOSs 22, 24, 26, and 28 perform switching in response to the differential input signals In1 and In2 supplied from the circuit in the preceding stage to supply differential output signals to both ends of the resistor 29 to be externally connected.

The NMOS 18 is connected to the power supply $V_{DD}$, and an output signal of the operational amplifier 16 is input to the gate of NMOS 18. The NMOS 20 is connected to the ground $V_{SS}$, and the reference voltage $V_{REF}2$ is input to the gate of NMOS 20. The NMOSs 22 and 24, and the NMOSs 26 and 28, are respectively connected in series between the NMOS 18 and the NMOS 20. The signal In1 is input to gates of the NMOSs 22 and 28. The signal In2 is input to gates of the NMOSs 24 and 26. The node between the NMOS 22 and the NMOS 24, and the node between the NMOS 26 and the NMOS 28 form output terminals of the output driver circuit.

To use the output driver circuit 10, for example, the external termination resistor 29 having a predetermined resistance value $R_T$ is connected between the output terminals.

In the driver circuit 12, in a case where the differential input signals In1 and In2 are at a high level and at a low level, respectively, the NMOS 22 and the NMOS 28 turn on, and the NMOS 24 and the NMOS 26 cut off. Then, the current $I_D$ flows from the power supply $V_{DD}$ to the ground $V_{SS}$ via the NMOS 18, the NMOS 22, the termination resistor 29, the NMOS 28, and the NMOS 20. On the other hand, in a case where the differential input signals In1 and In2 are at a low level and at a high level, respectively, the NMOS 22 and NMOS 28 cut off, and the NMOS 24 and NMOS 26 turn on. Then, the current $I_D$ flows from the power supply $V_{DD}$ to the ground $V_{SS}$ via the NMOS 18, the NMOS 26, the termination resistor 29, the NMOS 24, and the NMOS 20.

The replica circuit 14 includes the NMOS 30 corresponding to the NMOS 18 in the driver circuit 12, the NMOS 32 corresponding to the NMOS 22 or the NMOS 26, the two serially connected resistors 37a and 37b corresponding to the termination resistor 29, the NMOS 34 corresponding to the NMOS 28 or the NMOS 24, and the NMOS 36 corresponding to the NMOS 20.

A size of each NMOS that forms the replica circuit 14 is 1/n times (n is a positive integer) a size of the corresponding NMOS that forms the driver circuit 12. Each of the two resistors 37a and 37b has a resistance value $nR_T/2$ that is n/2 times a resistance value $R_T$ of the termination resistor 29.

The NMOSs 30 and 32, the resistors 37a and 37b, and the NMOSs 34 and 36 in the replica circuit 14 are connected in series, in that order, between the power supply $V_{DD}$ and the ground $V_{SS}$. An output signal of the operational amplifier 16 is input to a gate of the NMOS 30. The reference voltage $V_{REF}2$ is input to a gate of the NMOS 36. Gates of the NMOSs 32 and 34 are connected to the power supply $V_{DD}$.

The externally supplied reference voltage $V_{REF}2$ is commonly input to the gate of the NMOS 36 in the replica circuit 14 and the gate of the NMOS 20 in the driver circuit 12, and a current mirror circuit is formed. Since the NMOS 36 and the NMOS 20 form the current mirror circuit, the current $I_D/n$ flows in the replica circuit 14.

The externally supplied reference voltage $V_{REF}1$ is input to the positive input terminal in the operational amplifier 16. The voltage of the node between the NMOS 32 and the resistor 37a in the replica circuit 14 is fed back to the negative input terminal in the operational amplifier 16. By this configuration, the output signal of the operational amplifier 16 varies such that the voltage of the node between the NMOS 32 and the resistor 37a in the replica circuit 14 is equal to the reference voltage $V_{REF}1$.

The output signal of the operational amplifier 16 is commonly supplied to the gate of the NMOS 30 in the replica circuit 14 and the gate of the NMOS 18 in the driver circuit 12. Accordingly, the voltage of the node between the NMOS 32 and the resistor 37a in the replica circuit 14 varies simultaneously with the high-level voltage $V_{OH}$ of the differential output signals supplied to both ends of the termination resistor 29 from the driver circuit 12. As a result, the voltage $V_{OH}$ is controlled to be equal to the reference voltage $V_{REF}1$.

The output amplitude voltage $V_{od}$ of the differential output signals supplied from the driver circuit 12 to both ends of the termination resistor 29 is determined by a product of the resistance value $R_T$ of the termination resistor 29 and the current $I_D$ flowing in the driver circuit 12 ($V_{od}=R_T \times I_D$). Thus, $V_{od}$ is controlled in accordance with the reference voltage $V_{REF}2$.

As described below, in the output driver circuit 10, even if a mismatch exists between the resistance values of the built-in resistors 37a and 37b and the resistance value of the external termination resistor 29, the output common mode voltage $V_{oc}$ can be maintained at a certain value. When the resistance value $nR_T/2$ of the resistors 37a and 37b of the replica circuit vary, the voltage at the node between the resistor 37b and the NMOS 34 varies. However, the operational amplifier controls the voltages at the node between the NMOS 32 and the resistor 37a and the high-level voltage $V_{OH}$ without being affected by the voltage at the node between the resistor 37b and the NMOS 34.

The externally supplied reference voltage $V_{REF}2$ is commonly input to the gate of the NMOS 36 in the replica circuit 14 and the gate of the NMOS 20 in the driver circuit 12, and the current mirror circuit is formed. Accordingly, while the current $I_D$ flows in the driver circuit 12, the current in the amount of $I_D/n$ flows in the replica circuit 14. That is, by the externally supplied reference voltage $V_{REF}2$, the current $I_D$ in the driver circuit 12 and the current $I_D/n$ flows in the replica circuit 14 are controlled.

Further, the operational amplifier 16 performs feedback control. Accordingly, the voltage of the node between the NMOS 32 and the resistor 37a in the replica circuit 14 is controlled such that the voltage of the node is equal to the reference voltage $V_{REF}1$.

Figure 2:
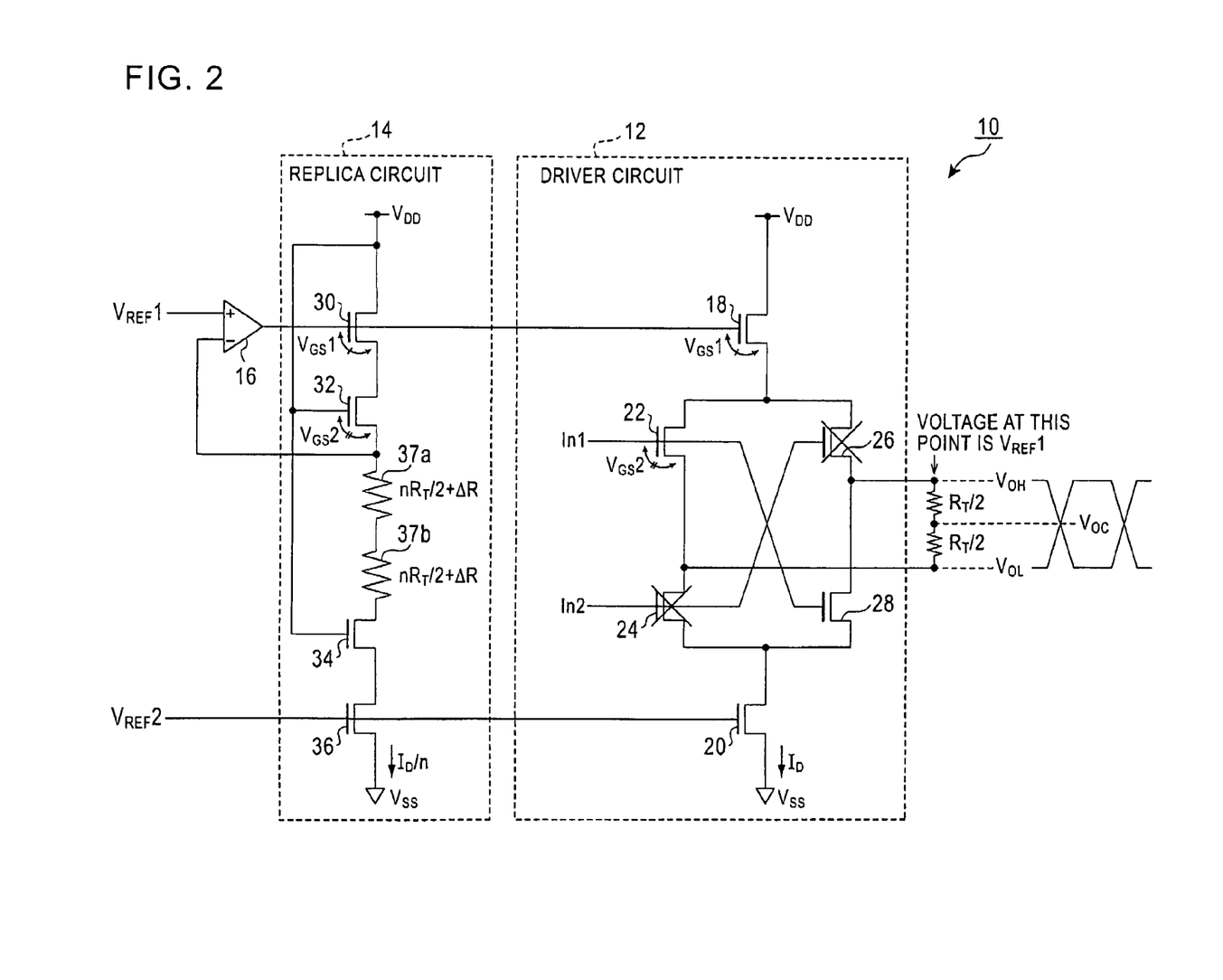
FIG. 2 is a schematic diagram for explaining an operation of the output driver circuit illustrated in FIG. 1.

The output signal of the operational amplifier 16 is commonly input to the gate of the NMOS 30 in the replica circuit 14 and the gate of the NMOS 18 in the driver circuit 12. Accordingly, as illustrated in FIG. 2, in a case where the NMOSs 22 and 28 turn on, and the NMOSs 24 and 26 cut off (in FIG. 2, indicated by 'x') in the driver circuit 12, gate-source voltages $V_{GS}1$ and $V_{GS}2$ of the NMOSs 18 and 22 in the driver circuit 12 are equal to gate-source voltages $V_{GS}1$ and $V_{GS}2$ of the NMOSs 30 and 32 in the replica circuit 14, respectively.

Accordingly, the voltage of the node between the NMOS 32 and the resistor 37a in the replica circuit 14 varies simultaneously with the high-level voltage $V_{OH}$ of the differential output signals supplied to an end of the termination resistor 29 from the driver circuit 12. That is, the high-level voltage $V_{OH}$ of the differential output signals can be controlled by the externally supplied reference voltage $V_{REF}1$ without being affected by the fluctuation of the resistance values $nR_T/2$.

The output amplitude voltage $V_{od}$ of the differential output signals is $V_{od}=R_T \times I_D$, which is a product of the resistance value $R_T$ of the termination resistor 29 and the current $I_D$ flowing in the driver circuit 12 in accordance with the reference voltage $V_{REF}2$. The variation of the resistance value $R_T$ of the termination resistor 29 is small. Further, the reference voltage $V_{REF}2$ controls the current ID. Accordingly, the variation of the output amplitude voltage $V_{od}$ is small. The output common mode voltage $V_{oc}$ is $(V_{OH}+V_{OL})/2=(2V_{OH}-V_{od})/2$. The value of $V_{OL}$ is determined by the high-level voltage $V_{OH}$ of the differential output signals and the output amplitude voltage $V_{od}$. Because the variation of the output amplitude voltage $V_{od}$ is small, the variation of the output common mode voltage $V_{oc}$ is small.

Accordingly, the output common mode voltage $V_{oc}$ of the differential output signals can be maintained at a constant value without being affected by a fluctuation $\Delta R$ of the resistance values $nR_T/2$ of the resistors 37a and 37b embedded in the replica circuit 14.

The case where the NMOSs 22 and 28 cut off, and the NMOSs 24 and 26 turn on in the driver circuit 12, is similar to the above-described case.

In the output driver circuit 10 shown in FIG. 1, a feedback circuit including the operational amplifier 16 controls the gate voltage of the NMOS 18. Accordingly, fluctuation of the high-level voltage $V_{OH}$ of the differential output signal is minimized. On the other hand, by directly supplying the reference voltage $V_{REF}2$ to the gate of the NMOS 20, the current $I_D$ flowing in the driver circuit 12 is kept constant without using a feedback circuit. Thus, the output driver circuit 10 requires only one operational amplifier. Further, the output driver circuit 10 operates stably because it includes only one feedback circuit.

Figure 5:
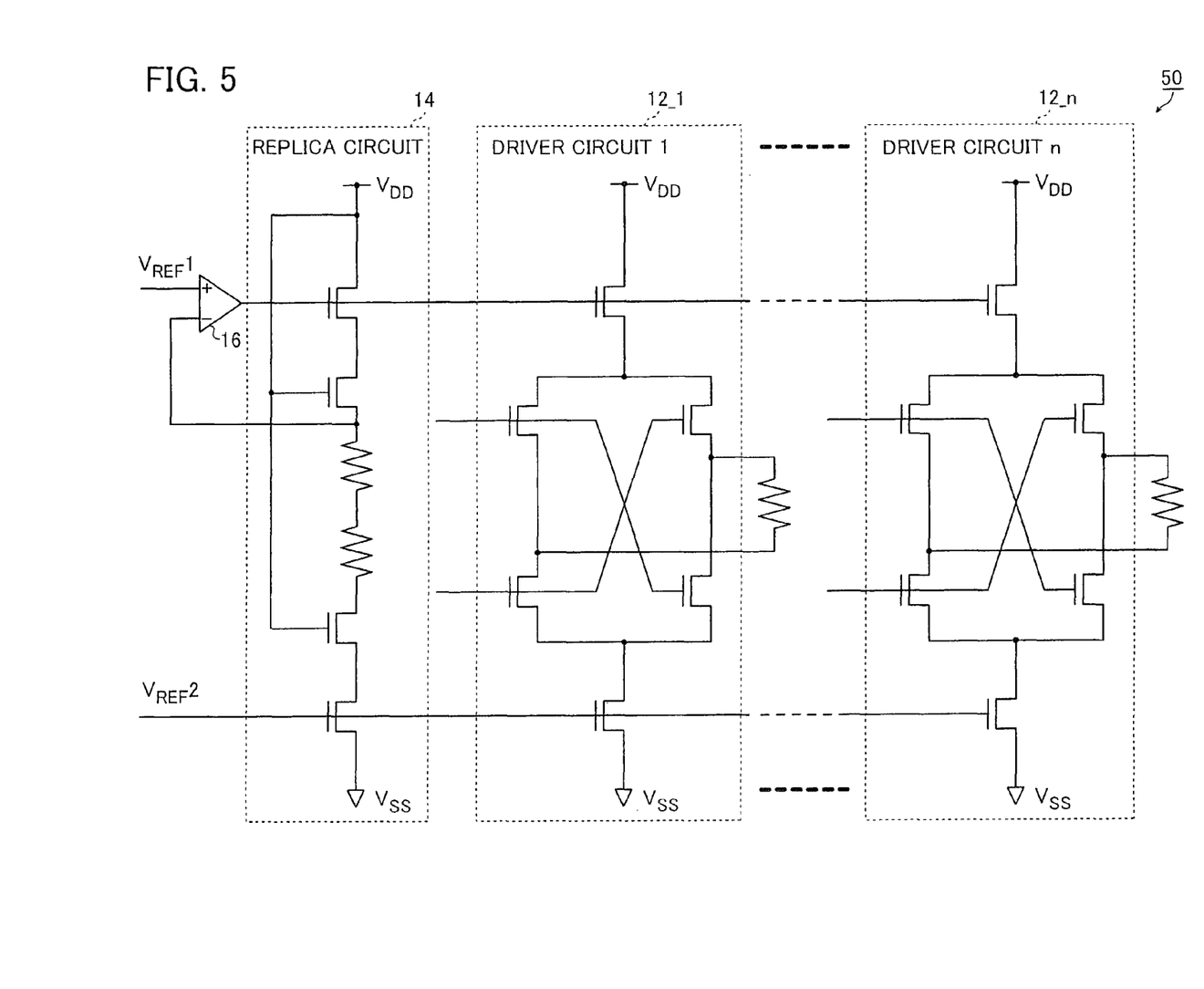
FIG. 5 is a view illustrating an exemplary embodiment of an output driver circuit according to this disclosure.

For simplicity of description, FIGS. 1 and 2 show how one driver circuit is used. However, one replica circuit 14 and one operational amplifier 16 can be commonly used by a plurality of driver circuits, as shown in FIG. 5 (see 12-1 to 12-n). Further, to ease the comparison with the output driver circuit 40, FIGS. 1 and 2 show the case that the two resistors 37a and 37b in the replica circuit 14 having the resistance value of n/2 times the resistance value of the termination resistor are connected in series. However, one resistor having a resistance value of n times the termination resistor can be used.

The driver circuit is not limited to the driver circuit shown in FIGS. 1 and 2, and a driver circuit configured to have similar functions can be used. The configuration of the driver circuit can be appropriately changed depending on the needs or desires of a user or designer of the driver circuit.

Further, in FIGS. 1 and 2, the gate voltage of the NMOS at the power supply (high voltage power supply) side is controlled to control the high-level voltage $V_{OH}$ of the driver circuit. However, a gate voltage of an NMOS at the ground (low voltage power supply) side can be controlled to control the low-level voltage $V_{OL}$ of the differential output signals in the driver circuit. In such a case, the NMOS at the power supply side determines the current in the driver circuit, and the NMOS at the ground side controls the low-level voltage $V_{OL}$ of the differential output signals of the driver circuit.

Further, in the embodiment, all transistors forming the output driver circuit are formed using NMOSs. However, the driver circuit is not limited to the above, and can be formed using P-type MOS transistors (hereinafter, referred to as PMOS). In such a case, it is preferable to change the connection state of the power supply and the ground. Further, the output driver circuit can be formed using both NMOS and PMOS transistors.

The output driver circuit described above is suitable to be used in an interface bus between a panel timing controller and column drivers, for example. However, the present invention can be applied to various purposes for which an output buffer circuit for outputting differential signals is used.

Although the replica circuit has been described above in detail, it is to be understood that the replica circuit is not limited to the above, but various changes and modifications may be made without departing from the scope of the invention.

What is claimed is:

1. An output driver circuit comprising:
   a driver circuit that includes:
      a first transistor connected to a first power supply, a second transistor connected to a second power supply, a third and a fourth transistor, and a fifth and a sixth transistor respectively connected in series between the first transistor and the second transistor,
      wherein differential input signals from a circuit in a preceding stage are input to gates of the third and sixth transistors and gates of the fourth and fifth transistors, respectively, and a node between the third and fourth transistors and a node between the fifth and sixth transistors form output terminals from which differential output signals are output;
   a replica circuit that includes:
      seventh and eighth transistors corresponding to the first and second transistors, respectively,
      ninth and tenth transistors corresponding to the third or fifth, and the fourth or sixth transistors, respectively, and
      a resistor corresponding to a termination resistor to be connected between the output terminals,
      wherein the seventh and ninth transistors, the resistor, and the tenth and eighth transistors are connected between the first and second power supplies, in that order, and the first power supply is input to gates of the ninth and tenth transistors; and
   wherein the output driver circuit further comprises:
      an operational amplifier that receives a first reference voltage and a voltage directly from a terminal of the ninth transistor which is directly connected to the resistor, and outputs a control signal to gates of the first and seventh transistors,
   wherein a second reference voltage is input to gates of the second and eighth transistors so as to form a current mirror circuit.

2. The output driver circuit according to claim 1, wherein a size of each of the transistors in the replica circuit is 1/n times a size of the corresponding transistor in the driver circuit, n is an integer of one or more and a resistance value of the resistor in the replica circuit is n times a resistance value of the termination resistor.

3. The output driver circuit according to claim 1, wherein the driver circuit includes a plurality of the driver circuits, and the replica circuit and the operational amplifier are commonly used by the plurality of the driver circuits.

4. An output driver circuit comprising:
   a driver circuit that includes:
      a first transistor connected to a first power supply, a second transistor connected to a second power supply, a third and fourth transistor, and a fifth and a sixth transistor respectively connected in series between the first transistor and the second transistor, wherein:
      the third through the sixth transistors perform switching in response to differential input signals from a circuit in a preceding stage, and a node between the third and fourth transistors and a node between the fifth and sixth transistors form output terminals from which differential output signals are output;
      a control signal is input to a gate of the first transistor so that the first transistor controls i) a high-level voltage of the differential output signals when the first power supply is a high voltage power supply and the second power supply is a low voltage power supply, and ii) a low-level voltage of the differential output signals when the first power supply is the low voltage power supply and the second power supply is the high voltage power supply; and
      a second reference voltage is input to a gate of the second transistor so that the second transistor controls a current flowing in the driver circuit;
   a replica circuit that includes:
      seventh and eighth transistors corresponding to the first and second transistors, respectively, ninth and tenth transistors corresponding to the third or fifth, and the fourth or sixth transistors, respectively, and a resistor corresponding to a termination resistor to be connected between the output terminals, wherein
the seventh and ninth transistors, the resistor, and the tenth and eighth transistors are connected between the first and second power supplies, in that order, and the second reference voltage is commonly input to a gate of the eighth transistor so that the eighth transistor controls a current flowing in the replica circuit; and
a feedback circuit that outputs the control signal to a gate of the first transistor and to a gate of the seventh transistor such that a voltage at a terminal of the ninth transistor which is directly connected to the resistor is equal to a first reference voltage.

5. The output driver circuit according to claim 4, wherein the feedback circuit includes an operational amplifier that receives the first reference voltage and the voltage directly from the terminal of the ninth transistor, and outputs the control signal.

6. The output driver circuit according to claim 4, wherein a size of each of the transistors in the replica circuit is 1/n times a size of the corresponding transistor in the drive circuit, n is an integer of one or more and a resistance value of the resistor in the replica circuit is n times a resistance value of the termination resistor.

* * * * *